United States Patent
Allen et al.

(10) Patent No.: US 6,429,652 B1
(45) Date of Patent: Aug. 6, 2002

(54) SYSTEM AND METHOD OF PROVIDING A RESONANT MICRO-COMPASS

(75) Inventors: Mark G. Allen; Thierry C. Leichle, both of Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 09/598,621

(22) Filed: Jun. 21, 2000

Related U.S. Application Data (60) Provisional application No. 60/140,164, filed on Jun. 21, 1999.

(51) Int. Cl.[7] .............................................. G01R 33/02

(52) U.S. Cl. ......................... 324/259; 324/260; 33/355

(58) Field of Search ................................. 324/244, 259, 324/260, 256, 261; 33/361, 362, 300, 355

(56) References Cited

U.S. PATENT DOCUMENTS 5,731,703 A * 3/1998 Bernstein et al. ........... 324/256

* cited by examiner

*Primary Examiner*—Jay Patidar
(74) *Attorney, Agent, or Firm*—Thomas, Kayden, Horstemeyer & Risley, L.L.P.

(57) ABSTRACT

A resonant micro-compass for detecting the Earth's magnetic field while requiring minimal power is disclosed Generally, the micro-compass comprises a resonant structure that is driven at its resonant frequency, which requires minimal power. The resonant frequency of the resonant structure is then measured and the resonant structure is caused to oscillate. A magnet is located on the resonant structure such that introduction of the Earth's magnetic field to the oscillating resonant structure causes a reaction by the magnet which, in turn, changes the resonant frequency of the resonant structure to shift. This shift of resonant frequency is then measured, thereby allowing the micro-compass to detect the direction of the magnetic field with extreme accuracy.

30 Claims, 7 Drawing Sheets

SYSTEM AND METHOD OF PROVIDING A RESONANT MICRO-COMPASS

CROSS REFERENCE TO RELATED APPLICATIONS

This application claims priority to and the benefit of the filing date of U.S. Provisional Application Serial No. 60/140,164, filed on Jun. 21, 1999, and entitled "Resonant Micro-Compass," which is incorporated by reference herein in its entirety.

FIELD OF THE INVENTION

The present invention generally relates to magnetic field sensing and, more particularly, is related to a system and method for providing a resonant micro-compass that is capable of detecting the Earth's magnetic field, while consuming minimal power.

BACKGROUND OF THE INVENTION

For centuries the compass has provided an easy and inexpensive means of determining proper direction of travel. Even though people in earlier times did not understand the phenomenon of magnetic field interaction, they noticed the polarity of magnets and the action that the Earth's magnetic field produced on it. They were able to develop a very simple instrument consisting of a small, lightweight magnet, such as a needle, balanced on a nearly frictionless pivot point, which displayed the direction of the magnetic North at the point of observation. Generally, a compass is simply a magnetic field sensor that can determine the horizontal component of the Earth's magnetic field.

A large number of magnetic sensors exist which are based on different physical effects such as the Hall effect, the Zeeman effect and/or the magnetoresistive effect, that can either be used to measure the intensity of a magnetic field, or its direction. Magnetic sensors have assisted in the analyzing and controlling of many functions for many decades. These magnetic sensors vary in size, performance, complexity (from simple Vibrating Sample Magnetometers to Superconducting Quantum Interference Device (SQUID) Magnetometers), and field of application (such as brain function mapping, magnetic anomaly detection, mineral prospecting, non-contact switching, current measurement or magnetic readout memory).

However, few magnetic sensors such as search-coil magnetometers, flux-gate magnetometers or magnetoresistive magnetometers, and giant magnetoresistive field sensors, can be used as a compass of a relatively small size, such as within the millimeter or centimeter scale, that does not need a high power supply or a complicated and costly way to operate. Some companies provide small magnetic compasses, such as the Digital Magnetic Compass, by Leica, and the HMR 3000, by Honeywell, that are centimeter scale solid state sensors that require about a ten mA power supply. Unfortunately, even if research is performed to improve conventional existing systems, or find new and interesting ways to make compasses, those devices are still too large and/or consume too much power to be used in low-power and micro-scale applications. Such applications may include, but are not limited to, use within a wristwatch.

SUMMARY OF THE INVENTION

The present invention provides a resonant micro-compass for detecting the Earth's magnetic field while requiring minimal power.

Generally, in architecture, the micro-compass comprises a resonant structure that is driven at its resonant frequency. The resonant frequency of the resonant structure is then measured. A magnet is located on the resonant structure such that introduction of a magnetic field, such as the Earth's magnetic field, to the micro-compass causes a reaction by the magnet which, in turn, causes the resonant frequency of the resonant structure to shift. This shift of resonant frequency is then measured, thereby allowing the micro-compass to detect the direction of the magnetic field with extreme accuracy.

The invention also provides a method for determining the direction of the Earth's magnetic field while using a micro-compass that utilizes minimal power. The method can be summarized by the steps of resonating a resonant material wherein the resonating material has magnetic properties that enable the resonating material to resonate; measuring the resonant frequency of the resonating material; subjecting the resonating material to a magnetic field; and measuring a shift in the resonant frequency of the resonating material where the measurement is indicative of the angle between the magnetic field and the micro-compass and allows the micro-compass to detect the direction of the magnetic field.

The invention has numerous advantages, a few of which are delineated hereafter as examples. Note that the embodiments of the invention, which are described herein, possess one or more, but not necessarily all, of the advantages set out hereafter.

One advantage of the invention is that it provides a micro-scaled magnetic field sensor that consumes very low power.

Another advantage is that while it is capable of detecting the Earth's magnetic field, it is also small enough to enable use in many applications.

Other features and advantages of the present invention will become apparent to one with skill in the art upon examination of the following drawings and detailed description. It is intended that all such additional features and advantages be included herein within the scope of the present invention, as defined by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1A:
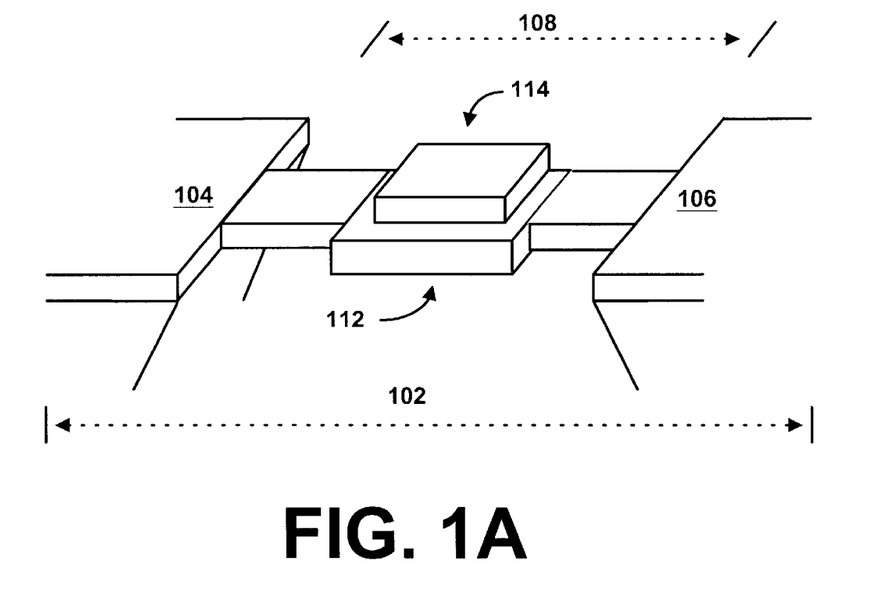
FIG. 1A illustrates a resonant structure that is used in the construction of a micro-compass, in accordance with the preferred embodiment of the invention

Referring now to the drawings, wherein like reference numerals designate corresponding parts throughout the drawings, FIG. 1A illustrates a resonant structure 102 that is used in the construction of a micro-compass 100 (FIG. 8), in accordance with the preferred embodiment of the invention. As illustrated by FIG. 1A, the resonant structure 102 comprises a proximate portion 104 and a distal portion 106. As known in the art, a resonant structure 102, or resonator, is a device that contains an element that vibrates at its mechanical resonant frequency. As such, a resonator belongs to the class of oscillators, for which energy alternates from one form of storage to another, for example from kinetic to potential energy.

Figure 1B:
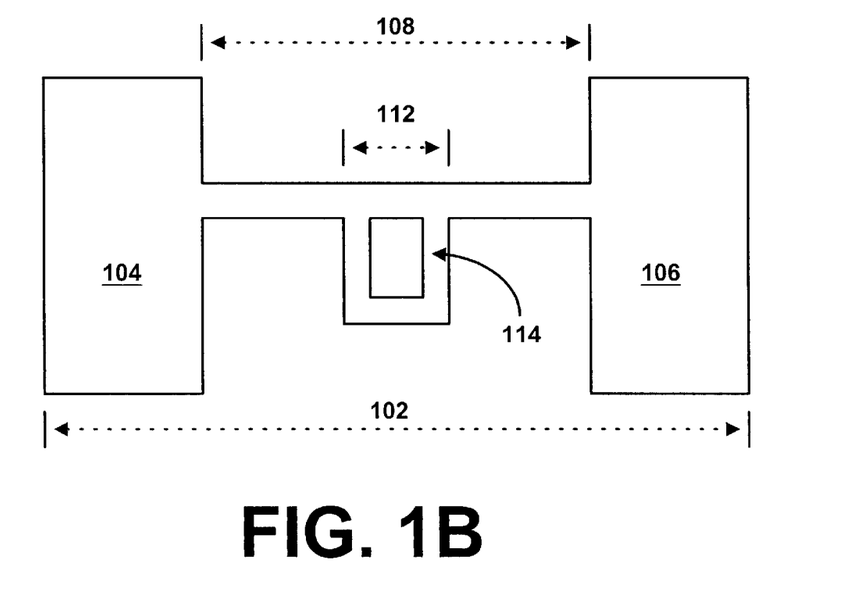
FIG. 1B is a top view of the resonant structure of FIG. 1A that illustrates the resonant structure that is used in the construction of a micro-compass in accordance with the preferred embodiment of the invention.

The resonant structure 102 is formed such that a resonant bridge 108 extends between the proximate 104 and distal 106 portions of the resonant structure 102. It should be noted that, although a bridge structure is shown in FIG. 1A, those skilled in the art will recognize that a variety of mechanically resonant structures, including strings, cantilever beams, etc., may be utilized. A central bridge portion 112 is located central to the resonant bridge 108 and extends horizontally from one side of the resonant bridge 108, perpendicular to the central axis of the resonant bridge 108 and on the same plane as the proximate 104 and distal portions 106 of the resonant structure 102. FIG. 1B is a top view of the resonant structure 102 that better illustrates the resonant bridge 108 in accordance with the preferred embodiment of the invention.

One skilled in the art will appreciate that the central bridge portion 112 need not be located exactly central to the resonant bridge 108 but may instead be located closer to the proximate 104 or distal 106 portions of the resonant structure 102. Basically, positioning of the central bridge portion 112 must allow for accurate measurement of changes in resonant frequency of the resonant bridge 108 when the resonant structure 102 is subject to the Earth's magnetic field. Therefore, the central bridge portion 112 may be located anywhere on the resonant bridge 108, as long as accurate measurement of changes in resonant frequency is possible.

A solid hard magnet material (magnet) 114 is located on a top surface of the central bridge portion 112 of the resonant bridge 108 such that movement of the solid magnet 114 in turn, provides force to the central bridge portion 112 of the resonant bridge 108, and therefore, the entire resonant bridge 108. In accordance with the preferred embodiment of the invention bonded ferrite, or other hard magnetic material, in a polymer matrix has been selected as the solid magnet material in order to avoid high temperature fabrication steps and to avoid difficulties that may be associated with bonding a solid magnet to a resonator. Such difficulties may include alignment and bonding of a conventional magnet on a relatively delicate flexure. However, the assembly and bonding of a conventional magnet to the structure does have the advantage of being able to use a magnet with excellent magnetic properties and could be used in an alternate embodiment of the invention. As known in the art, a bulk magnet may also be used as the solid magnet. One skilled in the art will appreciate that the solid magnet 114 may be fixed to the resonant bridge 108 by many different means, such as, but not limited to, bonding the solid magnet 114 to the central bridge portion 112 of the resonant bridge 108 using a means such as an adhesive; attaching to the central bridge portion 112 of the resonant bridge 108 by means such as a clamp; or connecting to the central bridge portion 112 of the resonant bridge 108 by means of screen printing, or by means of using magnetic fields (for example, emanating from a clamping magnet on the underside of the resonant bridge 108).

In accordance with the preferred embodiment of the invention, the solid magnet 114 is subjected to a magnetic field such that the magnetization vector of the solid magnet 114 is permanently fixed in a single direction. Thereafter, the solid magnet 114 is attached to the central bridge portion 112 of the resonant bridge 108 such that the direction of the magnetic field of the solid magnet 114 is parallel to the central axis of the resonant bridge 108, either from the proximate portion 104 to the distal portion 106 of a resonant structure 102, or vice-versa.

In accordance with the preferred embodiment of the invention, the resonant structure 102 is constructed of a single crystal material such as, but not limited to, single crystalline silicon or quartz. As one skilled in the art will appreciate, the resonant structure 102 need not be limited to being constructed by a single crystal material, but instead may be constructed of any material that is capable of resonating at a high amplitude without excessive consumption of power. Since both materials are anisotropic, anisotropic etchants can be used to obtain desired shapes. A main advantage to processing silicon is the several different fabrication techniques, well-known in the micro-machining art, for the precise control of the geometry of the structure. Although polycrystalline silicon does not show mechanical properties quite as high quality as many single crystal materials, it has characteristics which can be used to make the resonator structure 102 with very precisely controlled dimensions due to the standard process of deposition and stress control of fine grained polycrystalline silicon layers.

Figure 2A:
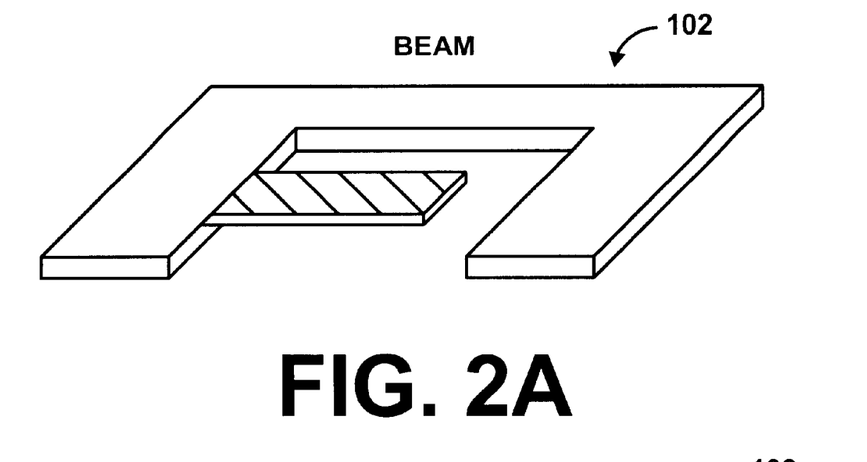
FIGS. 2A, 2B, and 2C illustrate three common shapes in which resonant structures, such as those illustrated by FIGS. 1A and 1B, may be fabricated.
Figure 2B:
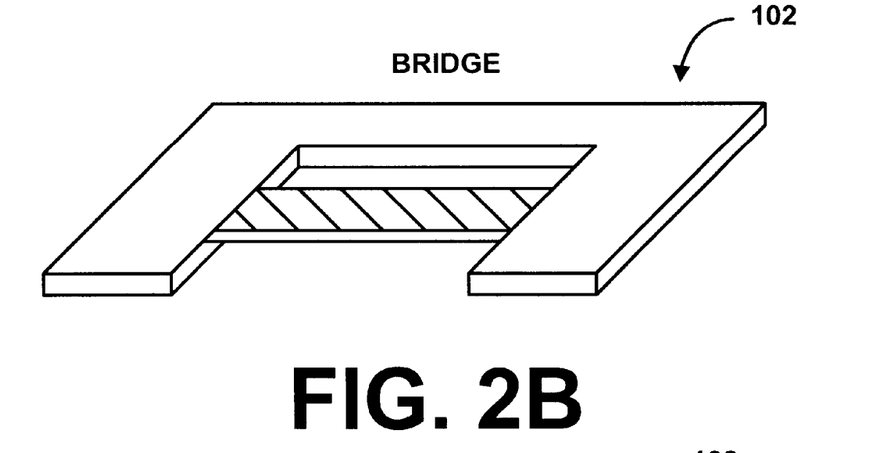
Figure 2C:
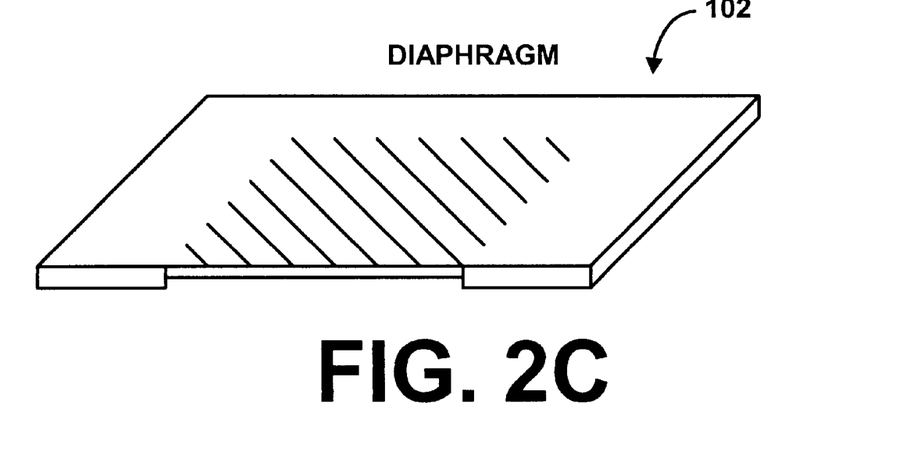

FIGS. 2A, 2B, and 2C illustrate three common shapes that exist for building resonators including the beam shape, the bridge shape, and the diaphragm shape. Each of these shapes, or structures, has several different resonant modes, where each mode has its own displacement pattern, resonant frequency, and quality factor. As known in the art, a quality factor is the ratio between the total energy stored in the system and the energy losses in the vibrating element. It can also be calculated from the curve of amplitude of the vibration element versus its frequency by taking the resonant frequency, divided by the frequency bandwidth, at the 3 dB amplitude points. In accordance with the preferred embodiment of the invention, as mentioned hereinabove, the bridge shape is used in constructing the resonator structure 102.

Figure 3:
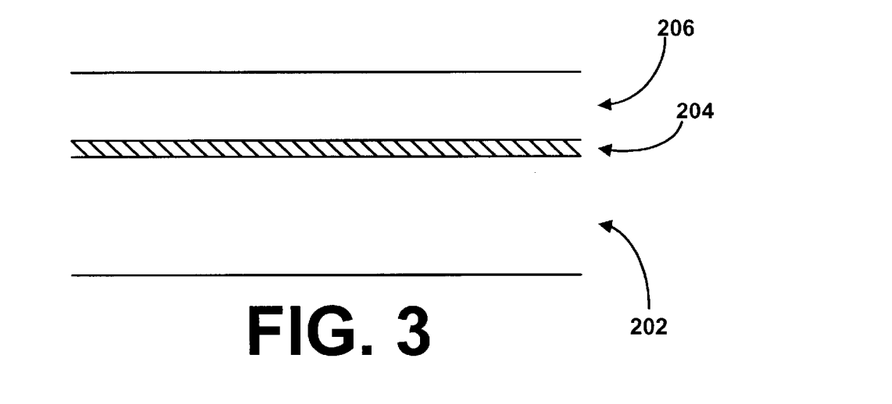
FIG. 3 illustrates layers of fabrication of a micro-compass in accordance with the preferred embodiment of the invention.

Fabrication of the micro-compass 100 is described with reference to FIGS. 3–6B described hereinbelow. As illustrated by FIG. 3, and in accordance with the preferred embodiment of the invention, the micro-compass 100 is constructed from silicon located on insulator wafers that comprise a lower layer 202, a central layer 204, and a top layer 206. Preferably, the lower layer 202 is 300 μm silicon, the central layer 204 is a 20 μm silicon dioxide, and the top layer 206 is a 20 μm silicon. A single crystal silicon has been selected as the resonator material due to its excellent mechanical properties and for its micro-machined simplicity compared to elements such as quartz. It should be noted, however, that alternate materials may be used as known by those skilled in the art, and, as such, the use of silicon described herein is merely an example is usable material.

Figure 4A:
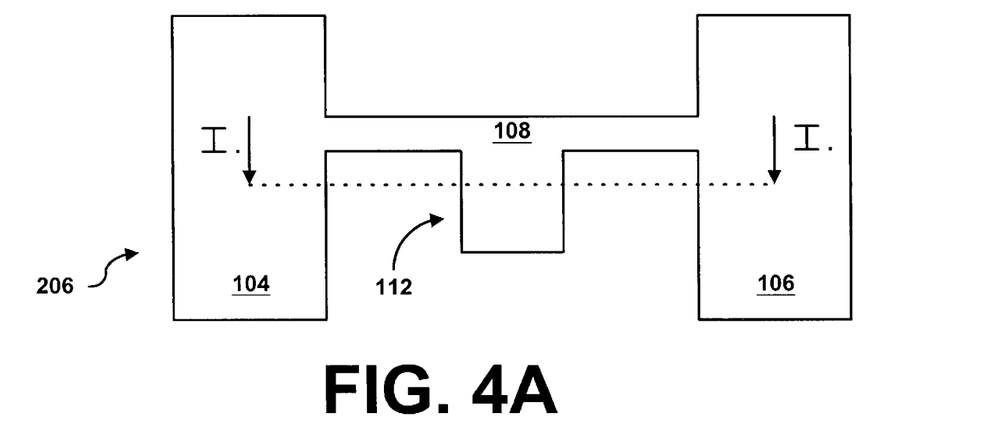
FIG. 4A is a top view illustration of the top layer of the resonant structure after being patterned.
Figure 4B:
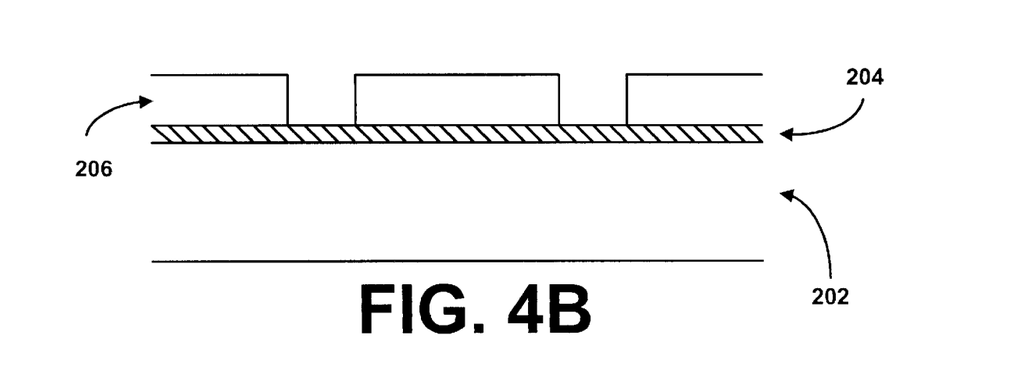
FIG. 4B is a cross-sectional view of the resonant structure of FIG. 4B across the axis A—A, after the top layer of the resonant structure has been patterned.

The silicon is then patterned as illustrated by FIG. 4A, which shows a top level view of the top layer 206 of the resonant structure 102, such that the top layer 206 of the silicon comprises the proximate portion 104, the distal portion 106, the resonant bridge 108, and the central bridge portion 112. FIG. 4B provides a cross section view of the resonant structure illustrated by FIG. 4A, along the axis A—A. As described hereinabove, with reference to FIG. 1A, the central bridge portion 112 of the resonant bridge 108 is located central to the resonant bridge 108 and extends horizontally from one side of the resonant bridge 108, perpendicular to the central axis of the resonant bridge 108, and on the same plane as the proximate 104 and distal portions 106 of the resonant structure 102. As known to one skilled in the art, multiple patterning methods may be used in order to pattern the silicon in accordance with the preferred embodiment of the invention including, but not limited to, dry and wet etching.

Figure 5A:
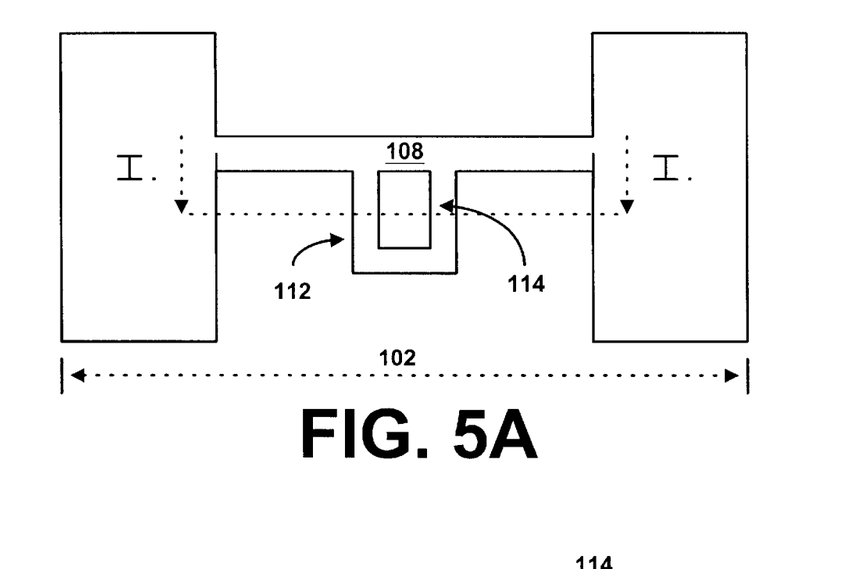
FIG. 5A is a top view illustration of the resonant structure of FIGS. 1A and 1B, wherein a solid magnet has been bonded to the central bridge portion of the resonant bridge.
Figure 5B:
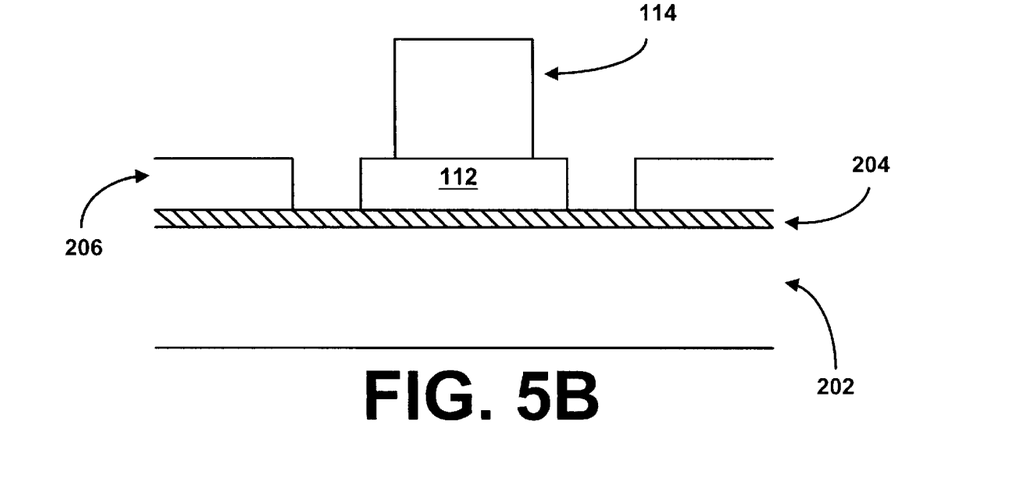
FIG. 5B is a cross-sectional view of the resonant structure of FIG. 5A across the axis A—A.

After patterning the silicon in order to shape the resonant structure 102, the solid magnet 114 is preferably screen-printed on the central bridge portion 112 of the resonant bridge 108. It will be appreciated that the solid magnet 114 may be fixed to the central bridge portion 112 of the resonant bridge 108 by using any other method known in the art that will allow the solid magnet 114 to remain on the central bridge portion 112 of the resonant bridge 108 during vibration of the resonant structure 102. FIGS. 5A and 5B illustrate the bond between the solid magnet 114 and the central bridge portion 112 of the resonant bridge 108 wherein FIG. 5A is a top view illustration of the bond. As illustrated, FIG. 5B is a cross section of FIG. 5A along the axis A—A.

Figure 6A:
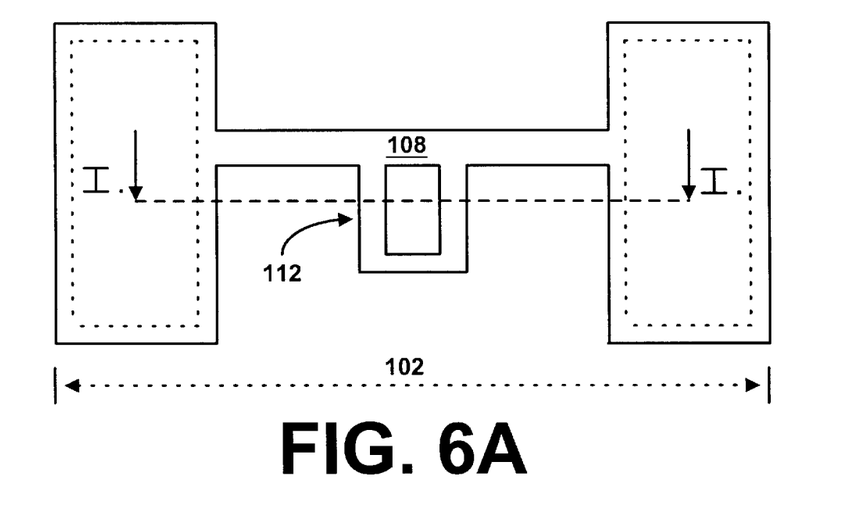
FIG. 6A is a top view of the patterned top level of the resonant structure of FIGS. 1A and 1B wherein a portion of a central layer of the resonant structure has been removed.
Figure 6B:
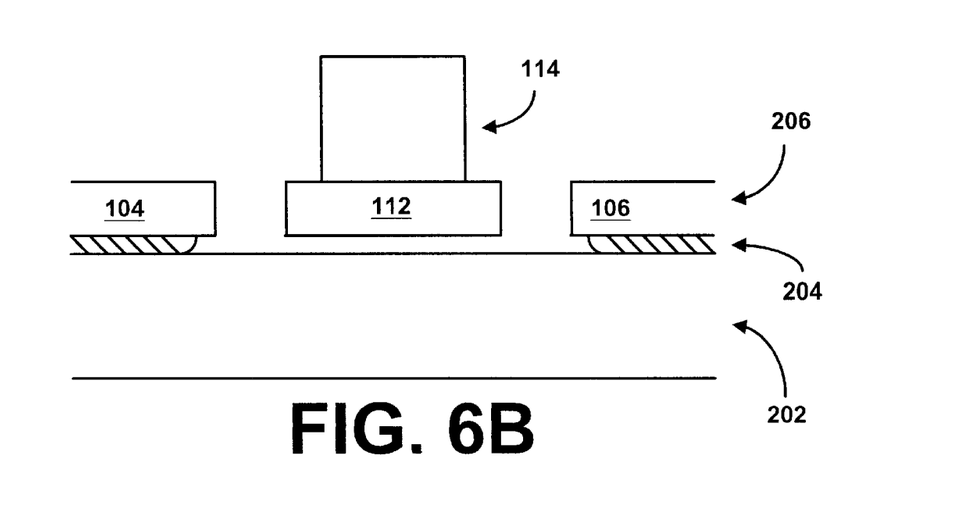
FIG. 6B is a cross-sectional view of the resonant structure of FIG. 6A across the axis A—A.

In accordance with the preferred embodiment of the invention, the patterned top layer 206 of silicon corresponding to the resonant bridge 108 and the central bridge portion 112 of the resonant bridge 108 is then released from the lower layer 202 of silicon by removing the central layer 204 of silicon dioxide. FIGS. 6A and 6B illustrate removal of the central layer 204, wherein FIG. 6A is a top level view of the patterned top level having the beginning of the silicon central layer 204 represented by dotted squares. Further, FIG. 6B is a cross-sectional view of FIG. 6A. Preferably, wet or dry isotropic etching of the sacrificial silicon dioxide is performed to free the resonant bridge 108 and the central bridge portion 112 of the resonant bridge 108 from the central layer 204 of silicon dioxide. As illustrated by FIGS. 6A and 6B, the proximate 104 and distal portions 106 of the resonant structure 102 remain connected to the lower layer 202 of silicon via the central layer 204 of silicon dioxide, such that the proximate 104 and distal 106 portions of the resonant structure 102 support the resonant bridge 108 and the central bridge portion 112 of the resonant bridge 108. This process allows the resonant bridge 108 and the central bridge portion 112 of the resonant bridge 108 to vibrate while being supported by the proximate 104 and distal 106 portions of the resonant structure 102.

Figure 7A:
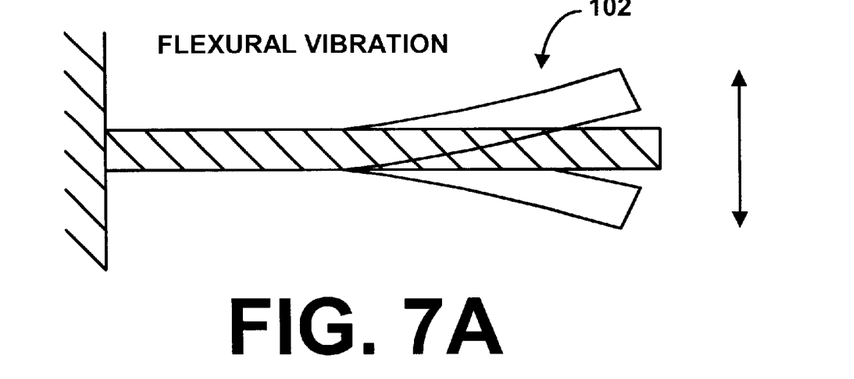
FIGS. 7A, 7B, and 7C illustrate vibration of the resonant structure of FIGS. 1A and 1B in three different modes of vibration.
Figure 7B:
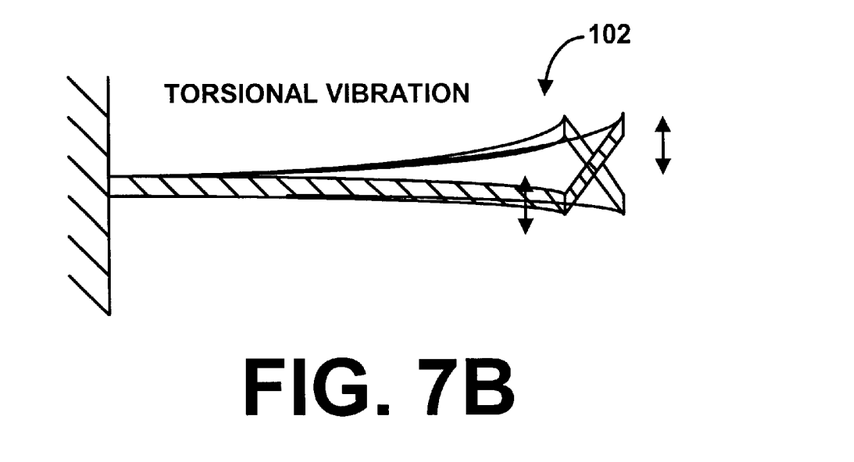
Figure 7C:
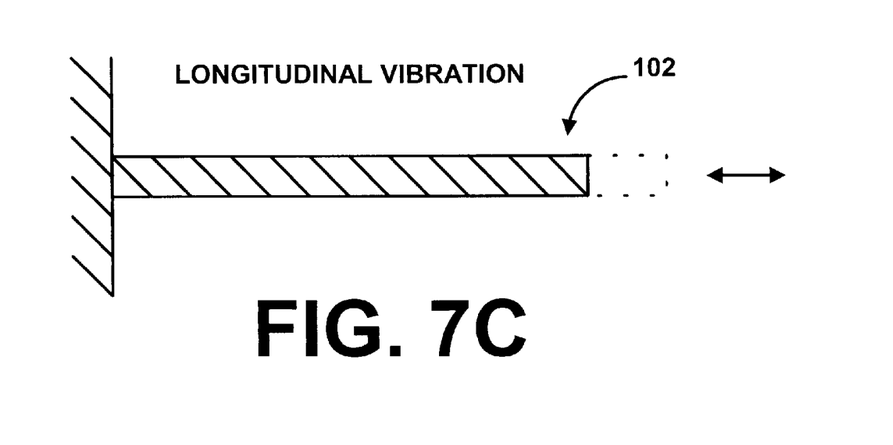

When vibrating, the resonant structure 102, including the bridge 108 and central bridge portion 112 of the resonant bridge 108, may vibrate in numerous different modes. FIGS. 7A, 7B, and 7C illustrate vibration of a resonant structure in different modes of vibration. As shown by FIGS. 7A, 7B, and 7C, a resonant structure may vibrate in a flexural vibration mode, a torsional vibration mode, or a longitudinal vibration mode. Those of ordinary skill in the art will appreciate that a resonant structure may also vibrate in other modes known in the art, and, as such, the aforementioned vibration modes are merely provided as examples. Preferably, the resonant structure 102 vibrates in torsional mode.

Figure 8:
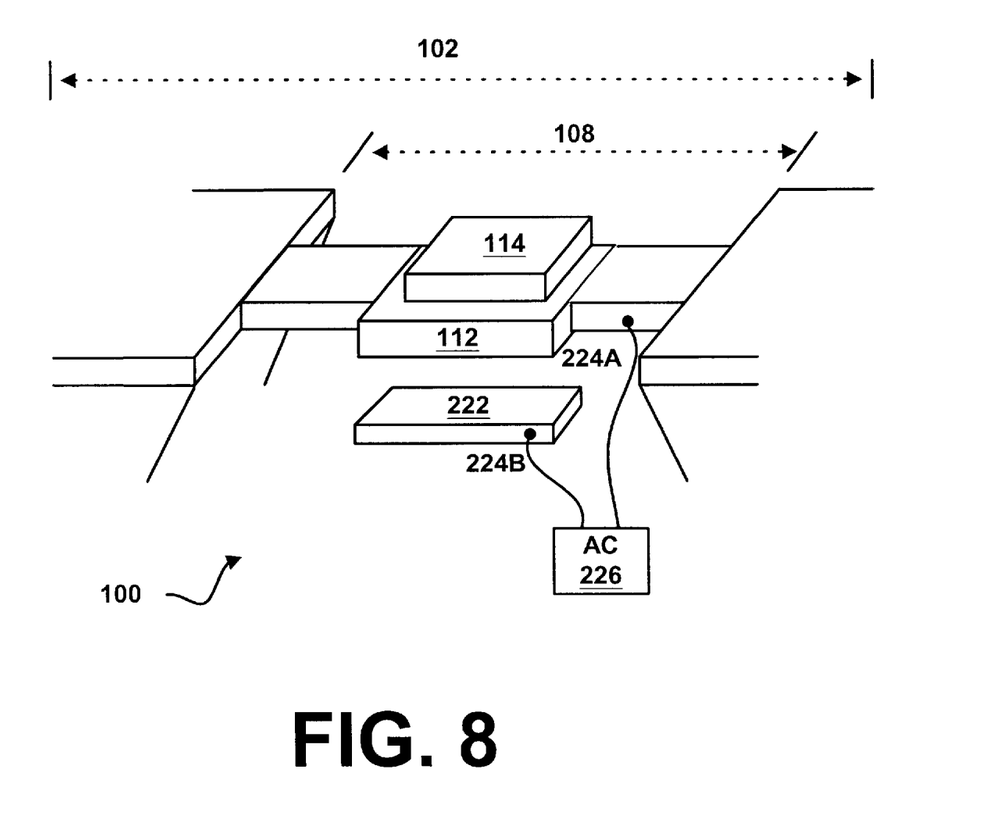
FIG. 8 illustrates the micro-compass in accordance with the preferred embodiment of the invention.

Numerous ways exist to drive the resonant structure 102 of the preferred embodiment of the invention at its resonant frequency, and to sense the response of the resonant structure 102. As illustrated by FIG. 8, electrostatic exitation and capacitive detection are used within the micro-compass 100. An electrode plate 222 is located below the central bridge portion 112 of the resonant bridge 108. In accordance with the preferred embodiment of the invention, the electrode plate 222 and the central bridge portion 112 of the resonant bridge 108 form a capacitor. An alternating current (AC), superposed with a direct current (DC), voltage is provided to the electrode plate 222 to cause the central bridge portion 112 of the resonant bridge 108, and therefore, the resonant bridge 108 itself, to resonate. Only a very low amount of power is required to initiate and maintain oscillation of the resonant bridge 108. Minimal power is required since only minimal displacement current need be applied to the electrode plate 222 to cause the resonant bridge 108, bearing the solid magnet 114, to resonate. As a result of the aforementioned, the resonant bridge 108 is pulled toward the electrode plate 222 by means of application of the electrostatic voltage, or moves back from the electrode plate 222 due to the restoring force of the resonant bridge 108. Once initial reaction between the solid resonant bridge 108 and the electrode plate 222 has begun, minimal electrical power is required to maintain oscillation of the resonate structure 102.

In accordance with the preferred embodiment of the invention, to assist in resonating the resonate structure 102 and to detect changes in resonance, a pair of electrodes 224A, 224B are used wherein a first electrode 224A is attached to the resonant bridge, and a second electrode 224B is attached to the electrode plate 222. It should be noted that the number of electrodes may differ, as long excitation and detection, as described herein, are enabled. Electrostatic actuation of the resonate structure 102 may then be provided by a AC voltage source 226 that is connected to the electrode plate 222 in order to make the resonant structure 102 resonate. The capacitance provided between the electrode plate 222 and the bottom of the central bridge portion 112 of the resonant bridge 108 (the capacitive circuit) may also be measured via the first 224A and second 224B electrodes as described hereinbelow. After resonation of the resonant structure 102, the current that flows within the capacitive circuit is measured. Current within the capacitive circuit depends on the frequency of vibration of the resonant structure 102. Further, at a given excitation frequency an increase in current within the capacitive circuit is responsive to an increase in amplitude. The resonant frequency of the resonant structure 102 is determined by scanning the frequency of the resonating resonant bridge 108 and searching for the point where electrically, there is a peak in current level, wherein the peak is the resonant frequency of the resonant structure 102.

Measurement of resonant frequency is performed by measuring the capacitance between the bottom of the central bridge portion 112 of the resonant bridge 108 and the electrode plate 222. Using the AC voltage source 226, the resonant bridge 108 is caused to resonate at its resonant frequency. Once the micro-compass is subjected to the Earth's magnetic field, the interaction of the Earth's magnetic field with that of the magnet 114 on the resonant bridge 108 causes the resonant frequency of a portion of the bridge 108 to shift. The magnitude and direction (e.g., upward or downward) of the shift will depend on the angle between the magnetization of the magnet and the Earth's magnetic field. This change in resonant frequency is then measured. The measurement of the change in resonant frequency within the resonant bridge 108 is therefore indicative of the angle between the Earth's magnetic field and the micro-compass, and allows the micro-compass 100 to detect the direction of the Earth's magnetic field with extreme accuracy.

An example of calculation of the sensitivity under simplifying assumptions of the micro-compass 100 is shown hereinbelow. The external field provided by the Earth's magnetic field is the origin of a torque produced on the solid magnet 114, which, in turn, depends on the angle θ between the direction of the magnetic field and the direction of the magnetization of the solid magnet 114. Under simplifying assumptions, this torque can be shown to be:

$$\tau = \mu_0 H \times m \times \sin\theta \quad \text{(Eq. 1)}$$

where $\mu_0 H$ is the external flux provided by the Earth's magnetic field, and m is the magnetic moment of the solid magnet 114, which can be related to the magnetic field, B, produced by the solid magnet 114 and its volume, V, by $$M = m \times V = (B \times V)/\mu_0 \quad \text{(Eq. 2)}$$

therefore, $$\tau = H \times B \times V \times \sin\theta \quad \text{(Eq. 3)}$$

Therefore, since the Earth's magnetic field is approximately 1 Gauss, considering a solid magnet of $1.5 \times 0.5 \times 0.125$ mm$^3$, which produces a field of 3,000 Gauss, the maximum torque induced on the permanent magnet is $5.10^{-9}$ Nm. As such, to be able to determine the direction of the external field provided by the Earth's magnetic field, with a resolution of 1°, the sensitivity of the torque measurement is $$\Delta\tau = \tau_2 - \tau_1 = H \times B \times V \times (\sin\theta_2 - \sin\theta_1) \quad \text{(Eq. 4)}$$

with $|\theta_2 - f_1| = 1°$ and $\theta_2 = 90°$ (to be at the lowest sensitivity of the sine function). Therefore, the sensitivity of the micro-compass 100 will be 1° if the resonator 102 is designed to detect minimum torque differences of $7.10^{-13}$ Nm. Such torques are known in the micro-machining art; in addition, in some applications such as automotive or low cost wristwatch compasses, all that is needed is to discern the difference between principal directions such as north and northwest. In these reduced performance applications, the compass sensitivities required are on the order of 45°, simplifying the requirements on the resonator even further.

In accordance with a first alternate embodiment of the invention, the magnetic field characteristic of the solid magnet 114, for purposes of enabling performance of the micro-compass 100, is made possible without use of the solid magnet 114. The first alternate embodiment uses a beam shaped resonator (FIG. 2) wherein the beam portion of the resonator is constructed of a soft magnet material. As known in the art, soft magnet material is material that has a magnetic permeability exceeding unity (e.g., an 80%/20% alloy of nickel and iron, commonly referred to as permalloy), such that when a magnetic field is introduced to the soft magnet, the soft magnet material has a magnetic moment induced in it, and therefore acts as a magnet. However, when the magnetic field is removed from the soft magnet, the magnetic properties of the soft magnet are removed.

In accordance with the first alternate embodiment of the invention, the direction of the magnetic field of the soft magnet is parallel to what would have been the central axis of the resonant bridge 108 of the preferred embodiment, however, what was the resonant bridge 108 of the preferred embodiment, is actually the beam of the first alternate embodiment since the beam does not extend from the proximate portion 104 to the distal portion 106, or vice-versa. After initiating and continuing oscillation of the resonant structure 102, as in the preferred embodiment of the invention, introduction of the Earth's magnetic field to the micro-compass 100 causes a change in the resonance of the resonant structure 102 that may then be measured by means similar to those used for the preferred embodiment of the invention. This effect can be amplified by making one geometric direction of the soft magnetic material large compared with the other, thereby inducing an easy magnetic axis in the soft magnetic material as known in the art, and using this easy magnetic axis in an analogous manner to the magnetization vector of the permanent magnet material in the preferred embodiment.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The following is claimed:

1. A system for providing a resonant micro-compass that consumes low power, comprising:

a resonant structure being capable of resonating at a resonant frequency;

an excitation device being capable of causing said resonant structure to resonate at said resonant frequency;

a magnetic structure fixed to said resonant structure such that introduction of a magnetic field to said micro-compass results in a shift in resonant frequency of said resonant structure; and a resonant frequency reader being capable of reading the resonant frequency of said resonant structure.

2. The system of claim 1 wherein said excitation device is at least one electrode plate.

3. The system of claim 1, wherein said magnetic structure is a solid hard magnet material.

4. The system of claim 1, wherein power is provided to said resonant structure and said excitation device via a power supply, said power provided to said resonant structure being capable of initiating and maintaining oscillation of said resonant structure.

5. The system of claim 1, wherein said magnetic field is the Earth's magnetic field.

6. The system of claim 1, wherein said magnetic structure is fixed to said resonant structure via screen-printing.

7. The system of claim 1, wherein said resonant structure is further defined as having a proximate portion and a distal portion, wherein said magnet is located on a resonant bridge that is located between said proximate portion and said distal portion.

8. The system of claim 7, wherein said magnet is located on a central portion of said resonant bridge and said excitation device is located directly under said central portion.

9. The system of claim 1, wherein said resonant structure vibrates in a mode selected from the group consisting of flexural, torsional and longitudinal vibration modes.

10. A system for providing a resonant micro-compass that consumes low power, comprising:
a means for resonating at a resonant frequency;
a means for causing said means for resonating to resonate at said resonant frequency;
a magnetic means fixed to said means for resonating such that introduction of a magnetic field to said micro-compass results in a shift in resonant frequency of said means for resonating; and
a means for reading said resonant frequency.

11. The system of claim 10 wherein said means for causing said means for resonating to resonate is at least one electrode plate.

12. The system of claim 10, wherein said magnetic means is a solid hard magnet material.

13. The system of claim 10, wherein power is provided to said means for resonating and said means for causing said means for resonating to resonate via a power supply, said power provided to said means for resonating being capable of initiating and maintaining oscillation of said means for resonating.

14. The system of claim 10, wherein said magnetic field is the Earth's magnetic field.

15. The system of claim 10, wherein said means for resonating is further defined as having a proximate portion and a distal portion, wherein said magnetic means is located on a resonant bridge that is located between said proximate portion and said distal portion of said resonating means.

16. The system of claim 15, wherein said magnetic means is located on a central portion of said resonant bridge and said means for causing said means for resonating to resonate is located directly under said central portion.

17. The system of claim 10, wherein said means for resonating vibrates in a mode selected from the group consisting of flexural, torsional and longitudinal vibration modes.

18. A system for providing a resonant micro-compass that requires minimal power, comprising:
a resonant structure being capable of resonating at a resonant frequency, said resonant structure being fabricated of a soft magnet material, wherein the magnetic properties of said soft magnet material causes the introduction of a magnetic field to said micro-compass to result in a shift in resonant frequency of said resonant structure;
an excitation device being capable of causing said resonant structure to resonate at said resonant frequency; and
a resonant frequency reader.

19. The system of claim 18 wherein said excitation device is at least one electrode plate.

20. The system of claim 18, wherein power is provided to said resonant structure and said excitation device via a power supply, said power provided to said resonant structure being capable of initiating and maintaining oscillation of said resonant structure.

21. The system of claim 18, wherein said magnetic field is the Earth's magnetic field.

22. The system of claim 18, wherein said resonant structure is further defined as having a proximate portion, a distal portion, and a resonant beam.

23. The system of claim 22, wherein said excitation device is located directly under said resonant beam.

24. The system of claim 18, wherein said resonant structure vibrates in a mode selected from the group consisting of flexural, torsional and longitudinal vibration modes.

25. A method of determining the direction of the Earth's magnetic field while using a micro-compass that consumes low power, comprising the steps of:
resonating a resonant material, wherein said resonating material has magnetic properties that enable said resonant material to resonate;
measuring the resonant frequency of said resonating resonant material;
subjecting said resonating resonant material to a magnetic field; and
measuring a shift in the resonant frequency of said resonating resonant material, wherein said measurement is indicative of the angle between said magnetic field and said micro-compass, and allows said micro-compass to detect the direction of said magnetic field.

26. The method of claim 25, wherein said magnetic field is the Earth's magnetic field.

27. The method of claim 25, wherein said step of resonating said resonant material is provided by at least one electrode plate.

28. The method of claim 25, wherein said resonant material is a soft magnet.

29. The method of claim 25, wherein said resonant material further comprises a solid magnet located on said resonant material.

30. The method of claim 25, wherein the amount of power required by said micro-compass is the amount required to initiate and maintain oscillation of the resonant material.

* * * * *

UNITED STATES PATENT AND TRADEMARK OFFICE
CERTIFICATE OF CORRECTION

PATENT NO. : 6,429,652 B1
DATED : August 6, 2002
INVENTOR(S) : Allen et al.

It is certified that error appears in the above-identified patent and that said Letters Patent is hereby corrected as shown below:

Title page,
Item [57], ABSTRACT,
Line 10, "changes" should be deleted and replaced with -- causes --

Column 1,
Line 29, after "of" delete "the"

Column 2,
Line 51, after "invention" insert -- . --
Line 66, "A-A" should be deleted and replaced with -- I--I. --

Column 3,
Lines 5 and 10, "A-A" should be deleted and replaced with -- I--I. --

Column 4,
Line 10, "alternate" should be deleted and replaced with -- alternative --

Column 5,
Line 11, "alternate" should be deleted and replaced with -- alternative --
Line 13, after "example" "is" should be deleted and replaced with -- of --
Lines 20 and 43, "A-A" should be delete and replaced with -- I--I. --

Column 6,
Line 1, after "the" (second occurrence) insert -- resonant --
Line 45, after "bridge" insert -- 108 --
Line 50, "a" should be deleted and replaced with -- an --

Signed and Sealed this

Twenty-eighth Day of January, 2003

JAMES E. ROGAN
*Director of the United States Patent and Trademark Office*